(12) United States Patent
Khlat

(10) Patent No.: US 11,677,365 B2
(45) Date of Patent: Jun. 13, 2023

(54) ENVELOPE TRACKING POWER MANAGEMENT APPARATUS INCORPORATING MULTIPLE POWER AMPLIFIERS

(71) Applicant: Qorvo US, Inc., Greensboro, NC (US)

(72) Inventor: Nadim Khlat, Cugnaux (FR)

(73) Assignee: Qorvo US, Inc., Greensboro, NC (US)

( * ) Notice: Subject to any disclaimer, the term of this patent is extended or adjusted under 35 U.S.C. 154(b) by 153 days.

(21) Appl. No.: 17/142,507

(22) Filed: Jan. 6, 2021

(65) Prior Publication Data

US 2021/0211108 A1 Jul. 8, 2021

Related U.S. Application Data

(60) Provisional application No. 62/958,440, filed on Jan. 8, 2020.

(51) Int. Cl.
*H03F 3/04* (2006.01)
*H03F 1/02* (2006.01)
(Continued)

(52) U.S. Cl.
CPC .................. *H03F 3/24* (2013.01); *H03F 1/56* (2013.01); *H03F 3/189* (2013.01);
(Continued)

(58) Field of Classification Search
CPC ... H03F 3/24; H03F 1/56; H03F 3/189; H03F 2200/102; H03F 2200/435;
(Continued)

(56) References Cited

U.S. PATENT DOCUMENTS 5,507,171 A 4/1996 Mattes et al.
6,032,109 A 2/2000 Ritmiller, III
(Continued)

FOREIGN PATENT DOCUMENTS

JP S601915 A 1/1985

OTHER PUBLICATIONS

Ying, K. et al., "A Wideband Envelope Detector with Low Ripple and High Detection Speed," IEEE International Symposium on Circuits and Systems (ISCAS), May 27-30, 2018, Florence, Italy, IEEE, 5 pages.

(Continued)

*Primary Examiner* — Khanh V Nguyen
(74) *Attorney, Agent, or Firm* — Withrow & Terranova, P.L.L.C.

(57) ABSTRACT

An envelope tracking (ET) power management apparatus incorporating multiple power amplifiers is provided. The ET power management apparatus includes a single ET integrated circuit (ETIC) configured to provide multiple ET voltages to the multiple power amplifiers for amplifying a radio frequency (RF) signal concurrently. The ETIC includes multiple first ET voltage circuits configured to generate multiple first ET voltages and a second ET voltage circuit configured to generate a second ET voltage. The ETIC is configured to provide each of the first ET voltages to an output stage amplifier(s) in a respective one of the power amplifiers and provide the second ET voltage to a driver stage amplifier in all of the power amplifiers. By supporting the multiple power amplifiers using a single ETIC, it is possible to reduce footprint, power consumption, and heat dissipation in an electronic device employing the ET power management apparatus.

20 Claims, 4 Drawing Sheets

(51) Int. Cl.
*H03F 3/24* (2006.01)
*H03F 3/189* (2006.01)
*H03F 1/56* (2006.01)

(52) U.S. Cl.
CPC .. *H03F 2200/102* (2013.01); *H03F 2200/435* (2013.01); *H03F 2200/451* (2013.01); *H03F 2200/504* (2013.01)

(58) Field of Classification Search
CPC ......... H03F 2200/451; H03F 2200/504; H03F 1/0227; H03F 3/68; H03F 3/04; H03F 1/0244; H03F 1/0211; H03F 1/0222; H03G 3/3042
USPC .................................................. 330/136, 297
See application file for complete search history.

(56) References Cited

U.S. PATENT DOCUMENTS

| | | | |
|---|---|---|---|
| 6,556,077 B2 | 4/2003 | Schaffer et al. | |
| 6,724,202 B2 | 4/2004 | Tanizawa | |
| 7,616,062 B2 | 11/2009 | Miyamoto et al. | |
| 8,433,263 B2 | 4/2013 | Pratt et al. | |
| 9,190,959 B2 | 11/2015 | Camuffo et al. | |
| 9,288,098 B2 | 3/2016 | Yan et al. | |
| 10,439,557 B2 * | 10/2019 | Khlat | H03F 1/0227 |
| 11,018,627 B2 * | 5/2021 | Khlat | H03F 3/195 |
| 11,057,012 B2 * | 7/2021 | Khlat | H03F 1/02 |
| 2007/0290748 A1 | 12/2007 | Woo et al. | |
| 2011/0136452 A1 | 6/2011 | Pratt et al. | |
| 2014/0273897 A1 | 9/2014 | Drogi et al. | |
| 2021/0099135 A1 | 4/2021 | Balteanu et al. | |
| 2022/0085766 A1 | 3/2022 | Balteanu et al. | |

OTHER PUBLICATIONS

U.S. Appl. No. 17/142,350, filed Jan. 6, 2021.
Non-Final Office Action for U.S. Appl. No. 17/142,350, dated Sep. 15, 2022, 9 pages.
Notice of Allowance for U.S. Appl. No. 17/163,685, dated Aug. 29, 2022, 7 pages.
Notice of Allowance for U.S. Appl. No. 17/183,714, dated Dec. 7, 2022, 7 pages.

* cited by examiner

ENVELOPE TRACKING POWER MANAGEMENT APPARATUS INCORPORATING MULTIPLE POWER AMPLIFIERS

RELATED APPLICATIONS

This application claims the benefit of provisional patent application Ser. No. 62/958,440, filed Jan. 8, 2020, the disclosure of which is incorporated herein by reference in its entirety.

FIELD OF THE DISCLOSURE

The technology of the disclosure relates generally to an envelope tracking (ET) power management apparatus that includes multiple power amplifiers.

BACKGROUND

Mobile communication devices have become increasingly common in current society for providing wireless communication services. The prevalence of these mobile communication devices is driven in part by the many functions that are now enabled on such devices. Increased processing capabilities in such devices means that mobile communication devices have evolved from being pure communication tools into sophisticated mobile multimedia centers that enable enhanced user experiences.

A fifth-generation new radio (5G-NR) wireless communication system is widely regarded as a technological advancement that can achieve significantly higher data throughput, improved coverage range, enhanced signaling efficiency, and reduced latency compared to the existing third-generation (3G) and fourth-generation (4G) communication systems. A 5G-NR mobile communication device usually transmits and receives a radio frequency (RF) signal(s) in a millimeter wave (mmWave) RF spectrum that is typically above 6 GHz. Notably, the RF signal(s) transmitted in the mmWave RF spectrum may be more susceptible to propagation attenuation and interference that can result in substantial reduction in data throughput. To help mitigate propagation attenuation and maintain desirable data throughput, the 5G-NR mobile communication device may be configured to transmit the RF signal(s) simultaneously from multiple antennas using such spatial multiplexing schemes as multiple-input multiple-output (MIMO) and RF beamforming. As such, the 5G-NR mobile communication device needs to employ multiple power amplifiers to amplify the RF signal(s) before feeding to the multiple antennas.

Envelope tracking (ET) is a power management technique designed to improve operating efficiency of the power amplifiers. Specifically, the power amplifiers simultaneously amplify the RF signal(s) based on multiple ET voltages that track a time-variant power envelope of the RF signal(s). In a conventional implementation, the 5G-NR mobile communication device may employ multiple power management integrated circuits (ETICs) to simultaneously generate the multiple ET voltages for the multiple power amplifiers. However, employing multiple PMICs in the 5G-NR mobile communication device can lead to an increase in footprint, power consumption, and heat dissipation. In this regard, it is desirable to employ as lesser number of PMICs as possible in the 5G-NR mobile communication device.

SUMMARY

Embodiments of the disclosure relate to an envelope tracking (ET) power management apparatus incorporating multiple power amplifiers. In examples disclosed herein, a single ET integrated circuit (ETIC) is used to provide multiple ET voltages to the multiple power amplifiers for amplifying a radio frequency (RF) signal concurrently. The ETIC includes multiple first ET voltage circuits coupled in parallel between a common node and multiple first output nodes and configured to generate multiple first ET voltages. The ETIC also includes a second ET voltage circuit coupled between the common node and a second output node and is configured to generate a second ET voltage. In a non-limiting example, each of the multiple power amplifiers is a multi-stage power amplifier having a driver stage amplifier and an output stage amplifier(s). Accordingly, the ETIC is configured to provide each of the first ET voltages to the output stage amplifier(s) in a respective one of the power amplifiers and provide the second ET voltage to the driver stage amplifier in all of the power amplifiers. By supporting the multiple power amplifiers using a single ETIC, it is possible to reduce footprint, power consumption, and heat dissipation in an electronic device employing the ET power management apparatus.

In one aspect, an ET power management apparatus is provided. The ET power management apparatus includes an ETIC. The ETIC includes a number of first ET voltage circuits coupled between a common node and a plurality of first output nodes and each configured to generate a respective one of a number of first ET voltages at a respective one of the first output nodes based on a respective one of a number of first ET target voltages. The ETIC also includes a second ET voltage circuit coupled between the common node and a second output node and configured to generate a second ET voltage based on a second ET target voltage. The ETIC also includes a control circuit. The control circuit is configured to determine a maximum ET target voltage among the first ET target voltages. The ETIC is also configured to cause any one of the first ET voltage circuits receiving the maximum ET target voltage to provide the respective one of the first ET voltages to the common node as a common node voltage to thereby drive a low-frequency current from the common node toward the first output nodes and the second output node.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure, and together with the description serve to explain the principles of the disclosure.

DETAILED DESCRIPTION

Figure 1:
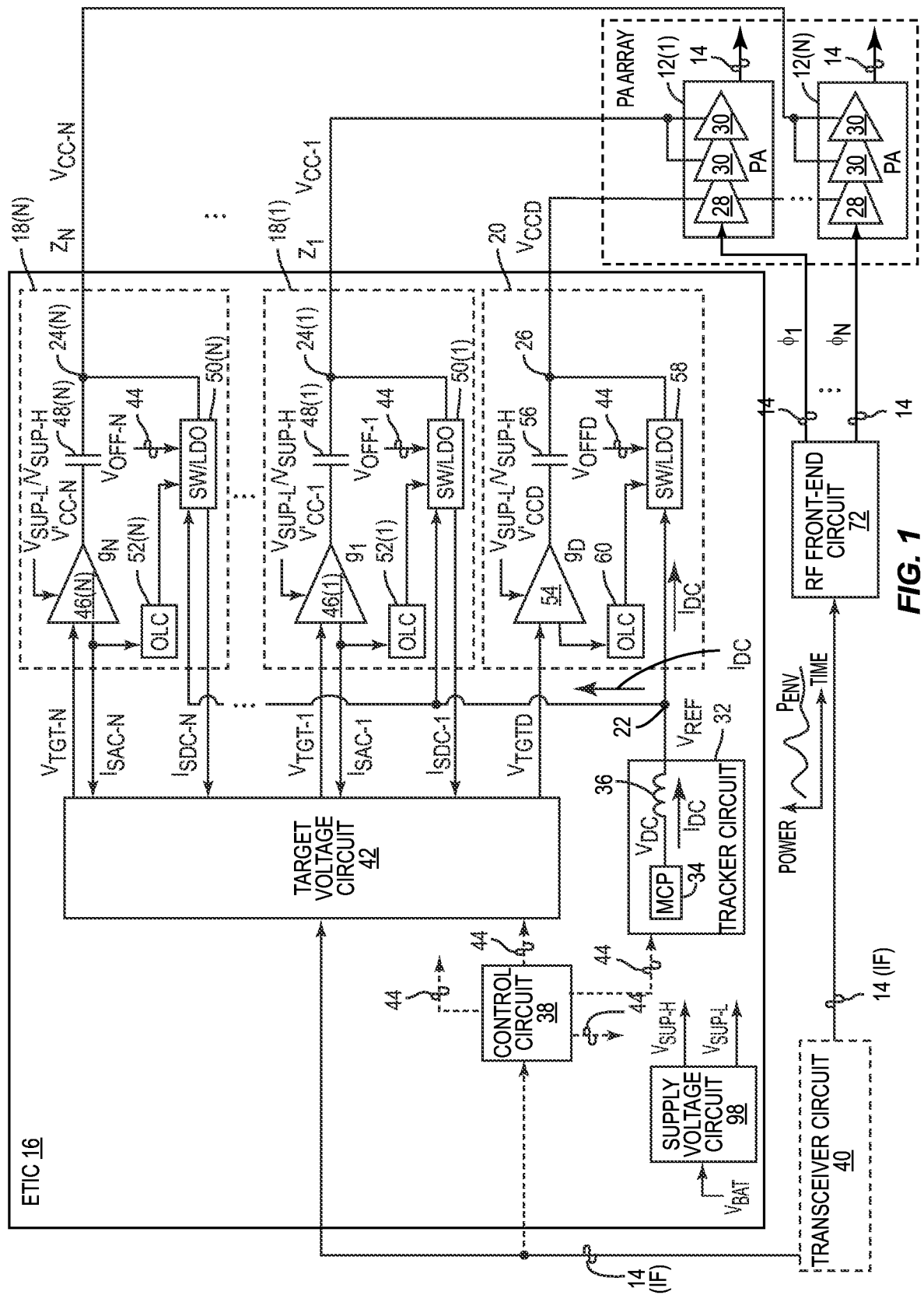
FIG. 1 is a schematic diagram of an exemplary ET power management apparatus configured according to an embodiment of the present disclosure to support multiple power amplifiers for amplifying concurrently a radio frequency (RF) signal based on a single ET integrated circuit (ETIC)

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

Embodiments of the disclosure relate to an envelope tracking (ET) power management apparatus incorporating multiple power amplifiers. In examples disclosed herein, a single ET integrated circuit (ETIC) is used to provide multiple ET voltages to the multiple power amplifiers for amplifying a radio frequency (RF) signal concurrently. The ETIC includes multiple first ET voltage circuits coupled in parallel between a common node and multiple first output nodes and configured to generate multiple first ET voltages. The ETIC also includes a second ET voltage circuit coupled between the common node and a second output node and is configured to generate a second ET voltage. In a non-limiting example, each of the multiple power amplifiers is a multi-stage power amplifier having a driver stage amplifier and an output stage amplifier(s). Accordingly, the ETIC is configured to provide each of the first ET voltages to the output stage amplifier(s) in a respective one of the power amplifiers and provide the second ET voltage to the driver stage amplifier in all of the power amplifiers. By supporting the multiple power amplifiers using a single ETIC, it is possible to reduce footprint, power consumption, and heat dissipation in an electronic device employing the ET power management apparatus.

FIG. 1 is a schematic diagram of an exemplary ET power management apparatus 10 configured according to an embodiment of the present disclosure to support a number of power amplifiers 12(1)-12(N) for amplifying concurrently an RF signal 14 based on a single ETIC 16. Notably, the RF signal 14 is associated with a time-variant power envelope $P_{ENV}$ that represents amplitude variation of the RF signal 14 from time to time. In a non-limiting example, the RF signal 14 is preprocessed to have a number of phases $\phi_1$-$\phi_N$ so determined to ensure phase coherency at an intended receiver (not shown). Accordingly, each of the power amplifiers 12(1)-12(N) is configured to amplify the RF signal 14 associated with a respective one of the phases $\phi_1$-$\phi_N$ for transmission to the intended receiver via, for example, RF beamforming.

The ETIC 16 includes a number of first ET voltage circuits 18(1)-18(N) and a second ET voltage circuit 20. The first ET voltage circuits 18(1)-18(N) are coupled in parallel between a common node 22 and a number of first output nodes 24(1)-24(N). Specifically, the first ET voltage circuits 18(1)-18(N) are configured to generate a number of first ET voltages $V_{CC-1}$-$V_{CC-N}$ at the first output nodes 24(1)-24(N) based on a number of first ET target voltages $V_{TGT-1}$-$V_{TGT-N}$, respectively. The second ET voltage circuit 20 is coupled between the common node 22 and a second output node 26. Specifically, the second ET voltage circuit 20 is configured to generate a second ET voltage $V_{CCD}$ at the second output node 26 based on a second ET target voltage $V_{TGTD}$.

In a non-limiting example, the power amplifiers 12(1)-12(N) are multi-stage power amplifiers. In this regard, each of the power amplifiers 12(1)-12(N) includes a driver stage amplifier 28 and one or more output stage amplifiers 30 that are coupled in series to the driver stage amplifier 28. Since the driver stage amplifier 28 and the output stage amplifiers 30 are coupled in series, the RF signal 14 may experience a temporal delay from the driver stage amplifier 28 to the output stage amplifiers 30. As such, the ETIC 16 can be configured to generate the first ET voltages $V_{CC-1}$-$V_{CC-N}$ and the second ET voltage $V_{CCD}$ to account for the temporal delay.

In embodiments discussed herein, the output stage amplifiers 30 in each of the power amplifiers 12(1)-12(N) is coupled to a respective one of the first output nodes 24(1)-24(N) to receive a respective one of the first ET voltages $V_{CC-1}$-$V_{CC-N}$. For example, the output stage amplifier 30 in the power amplifier 12(1) is coupled to the first output node 24(1) to receive the first ET voltage $V_{CC-1}$. In contrast, the driver stage amplifier 28 in all of the power amplifiers 12(1)-12(N) is coupled to the second output node 26 to receive the second ET voltage $V_{CCD}$. By supporting the power amplifiers 12(1)-12(N) using the single ETIC 16, it is possible to reduce footprint, power consumption, and heat dissipation in an electronic device employing the ET power management apparatus 10.

The ETIC 16 includes a tracker circuit 32, which is coupled to the common node 22 and configured to generate a low-frequency current $I_{DC}$ (e.g., a direct current) at the common node 22. In a non-limiting example, the tracker circuit 32 includes a multi-level charge pump (MCP) 34 and a power inductor 36 coupled in series. The MCP 34 is configured to generate a low-frequency voltage $V_{DC}$ (e.g., a constant voltage) at multiple levels. The power inductor 36, which is coupled between the MCP 34 and the common node 22, is configured to induce the low-frequency current $I_{DC}$ at the common node 22 based on the low-frequency voltage $V_{DC}$. Since the tracker circuit 32 is coupled to the common node 22, the tracker circuit 32 can be shared among the first ET voltage circuits 18(1)-18(N) and the second ET voltage circuit 20. As a result, it is possible to further reduce the footprint of the ETIC 16.

The ETIC 16 also includes a control circuit 38, which can be a microcontroller, a microprocessor, or a field-programmable gate array (FPGA), as an example. The control circuit 38 may be coupled to a transceiver circuit 40, which may or may not be part of the ET power management apparatus 10, to receive the RF signal 14 independent of the phases $\phi_1$-$\phi_N$. Accordingly, the control circuit 38 may be able to extract or detect the time-variant power envelope $P_{ENV}$ of the RF signal 14.

The ETIC 16 further includes a target voltage circuit 42 coupled to the control circuit 38, the first ET voltage circuits 18(1)-18(N), and the second ET voltage circuit 20. The target voltage circuit 42 may also be coupled to the transceiver circuit 40 to receive the RF signal 14. As discussed in more detail in FIG. 2, the target voltage circuit 42 is configured to generate the first ET target voltages $V_{TGT-1}$-$V_{TGT-N}$ and the second ET target voltage $V_{TGTD}$ based on the time-variant power envelope $P_{ENV}$ of the RF signal 14.

The control circuit 38 is configured to determine a maximum ET target voltage among the first ET target voltages $V_{TGT-1}$-$V_{TGT-N}$ on an ongoing basis, for example, based on a defined interval (e.g., a slot or a frame interval). Accordingly, the control circuit 38 can cause any one of the first ET voltage circuits 18(1)-18(N) that receives the maximum ET target voltage to provide the respective one of the first ET voltages $V_{CC-1}$-$V_{CC-N}$ to the common node 22 as a common voltage $V_{REF}$.

For example, if the first ET target voltage $V_{TGT-1}$ is determined to be the maximum ET target voltage among the first ET target voltages $V_{TGT-1}$-$V_{TGT-N}$ during the defined interval, then the control circuit 38 will control the first ET voltage circuit 18(1) to provide the first ET voltage $V_{CC-1}$ to the common node 22 as the common node voltage $V_{REF}$ ($V_{REF} \approx V_{CC-1}$). Since the first ET voltage $V_{CC-1}$ is generated based on the first ET target voltage $V_{TGT-1}$, the first ET voltage $V_{CC-1}$ will be the highest ET voltage among the first ET voltages $V_{CC-1}$-$V_{CC-N}$. As such, by applying the first ET voltage $V_{CC-1}$ to the common node 22 as the common node voltage $V_{REF}$, the common node voltage $V_{REF}$ will be higher than or equal to any of the first ET voltages $V_{CC-1}$-$V_{CC-N}$ and the second ET voltage $V_{CCD}$ during the defined interval to thereby drive the low-frequency current $I_{DC}$ from the common node 22 toward each of the first output nodes 24(1)-24(N) and the second output node 26.

The control circuit 38 may control the tracker circuit 32 to generate the low-frequency current $I_{DC}$ during the defined interval in accordance with the determined maximum ET target voltage among the first ET target voltages $V_{TGT-1}$-$V_{TGT-N}$. Specifically, the control circuit 38 may control the MCP 34 to generate the low-frequency voltage $V_{DC}$ at a voltage level corresponding to the determined maximum ET target voltage to thereby cause the low-frequency current $I_{DC}$ to be generated accordingly. By generating the low-frequency current $I_{DC}$ in accordance with the maximum ET target voltage among the first ET target voltages $V_{TGT-1}$-$V_{TGT-N}$, it helps to ensure that any of the first ET voltage circuits 18(1)-18(N) receiving the maximum ET target voltage can receive the low-frequency current $I_{DC}$ at a sufficient level to avoid potential voltage clipping.

However, generating the low-frequency current $I_{DC}$ in accordance with the maximum ET target voltage also means that the low-frequency current $I_{DC}$ may be excessive to any of the first ET voltage circuits 18(1)-18(N) not receiving the maximum ET target voltage. In this regard, the control circuit 38 may be configured to cause any of the first ET voltage circuits 18(1)-18(N) not receiving the maximum ET target voltage to regulate (e.g., reduce) the low-frequency current $I_{DC}$ received from the common node 22.

The control circuit 38 may control the target voltage circuit 42 to generate the second ET target voltage $V_{TGTD}$ to be identical to or different from the maximum ET target voltage among the first ET target voltages $V_{TGT-1}$-$V_{TGT-N}$. For example, the control circuit 38 can control the target voltage circuit 42 to generate the second ET target voltage $V_{TGTD}$ identical to the maximum ET target voltage when the RF signal 14 is modulated below a defined modulation bandwidth (e.g., <60 MHz) or different from the maximum ET target voltage otherwise.

When the RF signal 14 is modulated below the defined modulation bandwidth, the control circuit 38 may control the second ET voltage circuit 20 to provide the common node voltage $V_{REF}$ to the second output node 26 as the second ET voltage $V_{CCD}$ and pass the low-frequency current $I_{DC}$ directly from the common node 22 to the second output node 26. Otherwise, the control circuit 38 may control the second ET voltage circuit 20 to generate the second ET voltage $V_{CCD}$ in accordance with the second ET target voltage $V_{TGTD}$ and to regulate the low-frequency current $I_{DC}$ at the second output node 26. In a non-limiting example, the control circuit 38 can control the tracker circuit 32, the target voltage circuit 42, the first ET voltage circuits 18(1)-18(N), and the second ET voltage circuit 20 via a control signal 44.

According to an embodiment of the present disclosure, the first ET voltage circuits 18(1)-18(N) are configured to include a number of first voltage amplifiers 46(1)-46(N), a number of first offset capacitors 48(1)-48(N), a number of first hybrid circuits 50(1)-50(N) (denoted as "SW/LDO"), and a number of first offset-loop controllers 52(1)-52(N) (denoted as "OLC"), respectively. The second ET voltage circuit 20 includes a second voltage amplifier 54, a second offset capacitor 56, a second hybrid circuit 58 (denoted as "SW/LDO"), and a second offset-loop controller 60 (denoted as "OLC").

The first voltage amplifiers 46(1)-46(N) are each configured to have a respective one of a number of first amplifier gains $g_1$-$g_N$. Accordingly, the first voltage amplifiers 46(1)-46(N) can generate a number of first initial ET voltages $V'_{CC-1}$-$V'_{CC-N}$ based on the first ET target voltages $V_{TGT-1}$-$V_{TGT-N}$ and the first amplifier gains $g_1$-$g_N$, respectively. Each of the first offset capacitors 48(1)-48(N) is coupled between a respective one of the first voltage amplifiers 46(1)-46(N) and a respective one of the first output nodes 24(1)-24(N). The first offset capacitors 48(1)-48(N) are configured to raise the first initial ET voltages $V'_{CC-1}$-$V'_{CC-N}$ by a number of first offset voltages $V_{OFF-1}$-$V_{OFF-N}$ to generate the first ET voltages $V_{CC-1}$-$V_{CC-N}$ at the first output nodes 24(1)-24(N), respectively.

Notably, the power amplifiers 12(1)-12(N) may be current sources to the first ET voltage circuits 18(1)-18(N). As such, the power amplifiers 12(1)-12(N) may demand a higher or lower amount of current as the time-variant power envelope $P_{ENV}$ rises or falls. In this regard, the first voltage amplifiers 46(1)-46(N) may act as current sources to provide additional high-frequency currents (e.g., alternating currents) when the power amplifiers 12(1)-12(N) are in demand for a higher amount of current or act as current sinks to absorb excessive high-frequency currents when the power amplifiers 12(1)-12(N) are in demand for a lower amount of current. The high-frequency currents sourced or sunk by the first voltage amplifiers 46(1)-46(N) are hereinafter referred to as "first high-frequency currents." Accordingly, the first voltage amplifiers 46(1)-46(N) may be configured to generate a number of first high-frequency sense currents $I_{SAC-1}$-$I_{SAC-N}$ to proportionally indicate the high-frequency currents being sourced or sunk by the first voltage amplifiers 46(1)-46(N).

Each of the first hybrid circuits 50(1)-50(N) is coupled between the common node 22 and a respective one of the first output nodes 24(1)-24(N) and can be configured to operate in a switch mode, wherein the first hybrid circuits 50(1)-50(N) function as switches, or in a low-dropout (LDO) mode, wherein the first hybrid circuits 50(1)-50(N) function as LDO regulators. In this regard, the first hybrid circuits 50(1)-50(N) can be configured to generate a number of first low-frequency sense currents $I_{SDC-1}$-$I_{SDC-N}$ to proportionally indicate the low-frequency current $I_{DC}$ that flows through the first hybrid circuits 50(1)-50(N). Each of the first offset-loop controllers 52(1)-52(N), which can be a microprocessor or a microcontroller for example, is configured to control a respective one of the first hybrid circuits 50(1)-50(N) to regulate the low-frequency current $I_{DC}$ in the LDO mode. In a non-limiting example, each of the first offset-loop controllers 52(1)-52(N) can be configured to control a respective one of the first hybrid circuits 50(1)-50(N) in the LDO mode to regulate the low-frequency current $I_{DC}$ based on a respective one of the first high-frequency sense currents $I_{SAC-1}$-$I_{SAC-N}$.

The second voltage amplifier 54 is configured to have a second amplifier gain $g_D$. Accordingly, the second voltage amplifier 54 can generate a second initial ET voltage $V'_{CCD}$ based on the second ET target voltage $V_{TGTD}$ and the second amplifier gain $g_D$. The second offset capacitor 56 is coupled between the second voltage amplifier 54 and the second output node 26. The second offset capacitor 56 is configured to raise the second initial ET voltage $V'_{CCD}$ by a second offset voltage $V_{OFFD}$ to generate the second ET voltage $V_{CCD}$ at the second output node 26. The second hybrid circuit 58 is coupled between the common node 22 and the second output node 26. Like the first hybrid circuits 50(1)-50(N), the second hybrid circuit 58 can operate in the switch mode as a switch or in the LDO mode as an LDO regulator. The second offset-loop controller 60, which may be a microcontroller or a microprocessor, is configured to control the second hybrid circuit 58 to regulate the low-frequency current $I_{DC}$ in the LDO mode.

As previously discussed, the control circuit 38 is configured to determine the maximum ET target voltages among the first ET target voltages $V_{TGT-1}$-$V_{TGT-N}$ and cause any one of the first ET voltage circuits 18(1)-18(N) that receives the maximum ET target voltage to provide the respective one of the first ET voltages $V_{CC-1}$-$V_{CC-N}$ to the common node 22 as a common voltage $V_{REF}$. In this regard, the control circuit 38 can control a respective one of the first hybrid circuits 50(1)-50(N) in the any one of the first ET voltage circuits 18(1)-18(N) that receives the maximum ET target voltage to operate in the switch mode. For example, if the first ET voltage circuit 18(1) receives the maximum ET target voltage, the control circuit 38 can control the first hybrid circuit 50(1) to operate in the switch mode. Accordingly, the first hybrid circuit 50(1) will provide the first ET voltage $V_{CC-1}$ to the common node 22 as the common node voltage $V_{REF}$ and provide the low-frequency current $I_{DC}$ to the first output node 24(1).

For any of the first ET voltage circuits 18(1)-18(N) not receiving the maximum ET target voltage, the control circuit 38 can control a respective one of the first hybrid circuits 50(1)-50(N) in the any of the first ET voltage circuits 18(1)-18(N) to operate in the LDO mode to thereby regulate the low-frequency current $I_{DC}$. The control circuit 38 can further control the second hybrid circuit 58 in the second ET voltage circuit 20 to regulate the low-frequency current $I_{DC}$ at the second output node 26.

In the event that the RF signal 14 is modulated below the defined modulation bandwidth (e.g., <60 MHz), the control circuit 38 may deactivate the second voltage amplifier 54 and control the second hybrid circuit 58 to operate in the switch mode. Accordingly, the common node voltage $V_{REF}$ is provided to the second output node 26 as the second ET voltage $V_{CCD}$ and the low-frequency current $I_{DC}$ flows directly from the common node 22 to the second output node 26. By deactivating the second voltage amplifier 54, it may help to reduce power consumption and heat dissipation in the ETIC 16.

Notably, the ET power management apparatus 10 may be provided in a fifth-generation (5G) wireless device configured to transmit the RF signal 14 in a millimeter wave (mmWave) RF spectrum that is typically higher than 6 GHz. Accordingly, the RF signal 14 may be modulated in a wide modulation bandwidth (e.g., >200 MHz). In this regard, the power amplifiers 12(1)-12(N) can present different load-line impedances $Z_1$-$Z_N$ at the first output nodes 24(1)-24(N), respectively. In addition, due to presence of trace inductance between the first output nodes 24(1)-24(N) and the power amplifiers 12(1)-12(N) and finite output impedance by the first voltage amplifiers 46(1)-46(N), a frequency change behavior may occur in the ET power management apparatus 10. As such, it may be necessary to configure the target voltage circuit 42 to compensate for impedance variation among the load-line impedances $Z_1$-$Z_N$.

Figure 2:
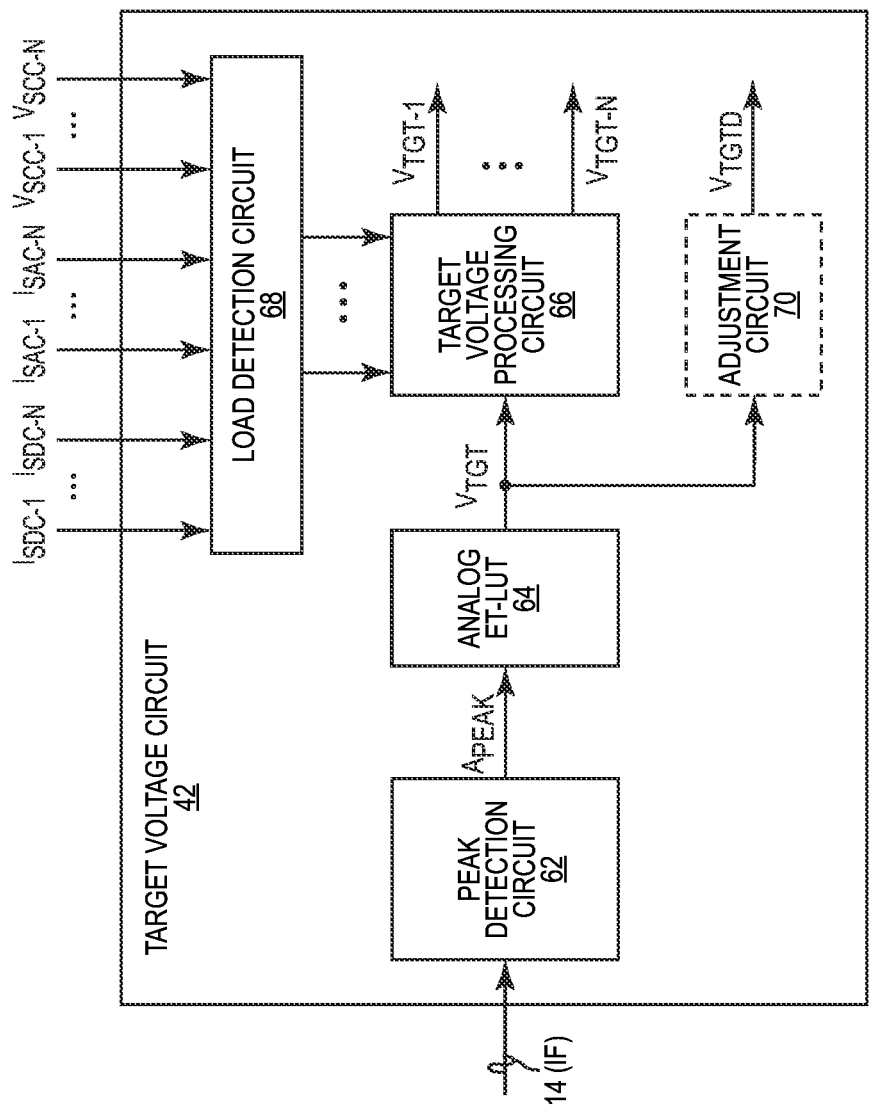
FIG. 2 is a schematic diagram providing an exemplary illustration of a target voltage circuit in the ET power management apparatus of FIG. 1 in accordance with an embodiment of the present disclosure.

In this regard, FIG. 2 is a schematic diagram providing an exemplary illustration of the target voltage circuit 42 in the ET power management apparatus 10 of FIG. 1 configured in accordance with an embodiment of the present disclosure. Common elements between FIGS. 1 and 2 are shown therein with common element numbers and will not be re-described herein.

The target voltage circuit 42 can be configured to include a peak detection circuit 62, an analog ET look-up table (LUT) (ET-LUT) circuit 64, a target voltage processing circuit 66, and a load detection circuit 68. The peak detection circuit 62, which can be integrated with or separated from the target voltage circuit 42, is configured to determine a peak amplitude $A_{PEAK}$ of the time-variant power envelope $P_{ENV}$ on an ongoing basis in each defined interval. The analog ET-LUT circuit 64 is configured to map the peak amplitude $A_{PEAK}$ to an ET target voltage $V_{TGT}$. The target voltage processing circuit 66 is configured to generate the first ET target voltages $V_{TGT-1}$-$V_{TGT-N}$ based on the ET target voltage $V_{TGT}$. The load detection circuit 68 is configured to estimate a respective one of the load-line impedances $Z_1$-$Z_N$ at each of the first output nodes 24(1)-24(N) and provide the estimated load-line impedances $Z_1$-$Z_N$ to the target voltage processing circuit 66. The target voltage circuit 42 may include an adjustment circuit 70 to individually equalize and/or scale the second ET target voltage $V_{TGTD}$.

With reference back to FIG. 1, the time-variant power envelope $P_{ENV}$ of the RF signal 14 is typically generated in baseband frequency by the transceiver circuit 40, which may be separate from an RF front-end circuit 72 and the ETIC 16 by a non-negligible distance. As such, the transceiver circuit 40 is typically configured to provide the RF signal 14 to the RF front-end circuit 72 and the ETIC 16 in an intermediate frequency (IF) (e.g., 3 GHz to 8 GHz) higher than the baseband frequency. The RF front-end circuit 72 will then upconvert the RF signal 14 into a higher carrier frequency and in the phases $\phi_1$-$\phi_N$ that can ensure phase coherence at the intended receiver.

In this regard, the peak detection circuit 62 in the target voltage circuit 42, as shown in FIG. 2, needs to extract the peak amplitude $A_{PEAK}$ of the time-variant power envelope $P_{ENV}$ on the ongoing basis based on the IF, which can be forty times higher than the modulation bandwidth of the RF signal 14. To ensure that the first ET voltages $V_{CC-1}$-$V_{CC-N}$ with the time-variant power envelope $P_{ENV}$, the peak detection circuit 62 may be required to extract the peak amplitude $A_{PEAK}$ with a very tight temporal constraint (e.g., <0.2 nanosecond).

Figure 3A:
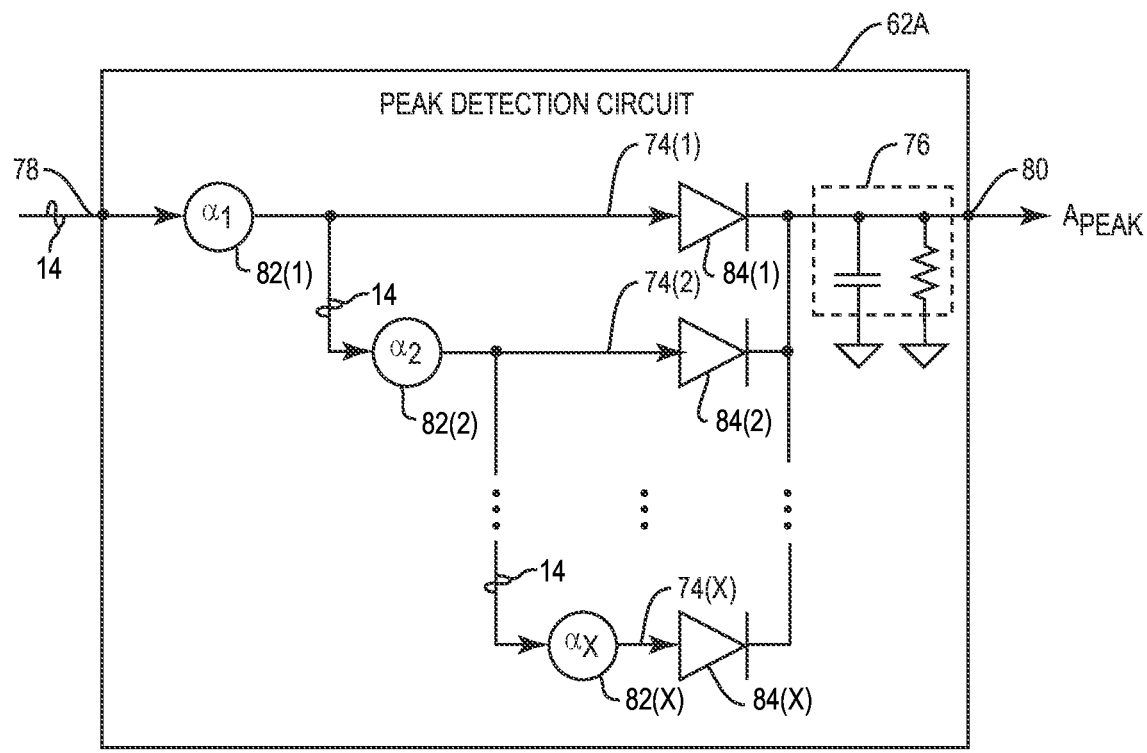
FIG. 3A is a schematic diagram of an exemplary peak detection circuit configured according to one embodiment of the present disclosure to support fast peak amplitude detection of the RF signal in FIG. 1.

FIG. 3A is a schematic diagram of an exemplary peak detection circuit 62A configured according to one embodiment of the present disclosure to support fast peak amplitude detection of the RF signal 14 in FIG. 1. Common elements between FIGS. 1, 2, and 3A are shown therein with common element numbers and will not be re-described herein.

As shown in FIG. 3A, the peak detection circuit 62A includes a number of signal branches 74(1)-74(X) and a resistor-capacitor (RC) circuit 76 coupled to the signal branches 74(1)-74(X). The peak detection circuit 62A is configured to receive the RF signal 14 in the IF via a first node 78 and output the peak amplitude $A_{PEAK}$ via a second node 80. Each of the signal branches 74(1)-74(X) includes a respective one of a number of phase shifters 82(1)-82(X) coupled in series to a respective one of a number of diodes 84(1)-84(X). Each of the phase shifters 82(1)-82(X) is configured to shift the RF signal 14 by a respective one of a number of predefined phases $\alpha_1$-$\alpha_X$. Accordingly, the RC circuit 76 can detect the peak amplitude $A_{PEAK}$ of the RF signal 14 concurrently across the predefined phases $\alpha_1$-$\alpha_X$.

By detecting the peak amplitude $A_{PEAK}$ concurrently across the predefined phases $\alpha_1$-$\alpha_X$, the peak detection circuit 62A is able to detect the peak amplitude $A_{PEAK}$ within the very tight temporal constraint with reduced ripples.

The signal branches 74(1)-74(X) are disposed according to a cascade arrangement. As shown in FIG. 3A, the signal branch 74(1) is coupled directly to the first node 78 to receive the RF signal 14. In contrast, each of the signal branches 74(2)-74(X) is coupled to a respective one of the phase shifters 82(1)-82(X-1) in an immediately preceding signal branch among the signal branches 74(1)-74(X-1). For example, the signal branch 74(2) is coupled to the phase shifter 82(1) in the signal branch 74(1) that immediately precedes the signal branch 74(2). In this regard, each of the phase shifters 82(2)-82(X) is configured to incrementally shift the RF signal 14 by a respective one of the predefined phases $\alpha_2$-$\alpha_X$. For example, if each of predefined phase $\alpha_1$-$\alpha_X$ is equal to five degrees (5°), the signal branch 74(1) will output the RF signal 14 with a 5° phase shift, the signal branch 74(2) will output the RF signal 14 with a 10° phase shift, and so on.

Figure 3B:
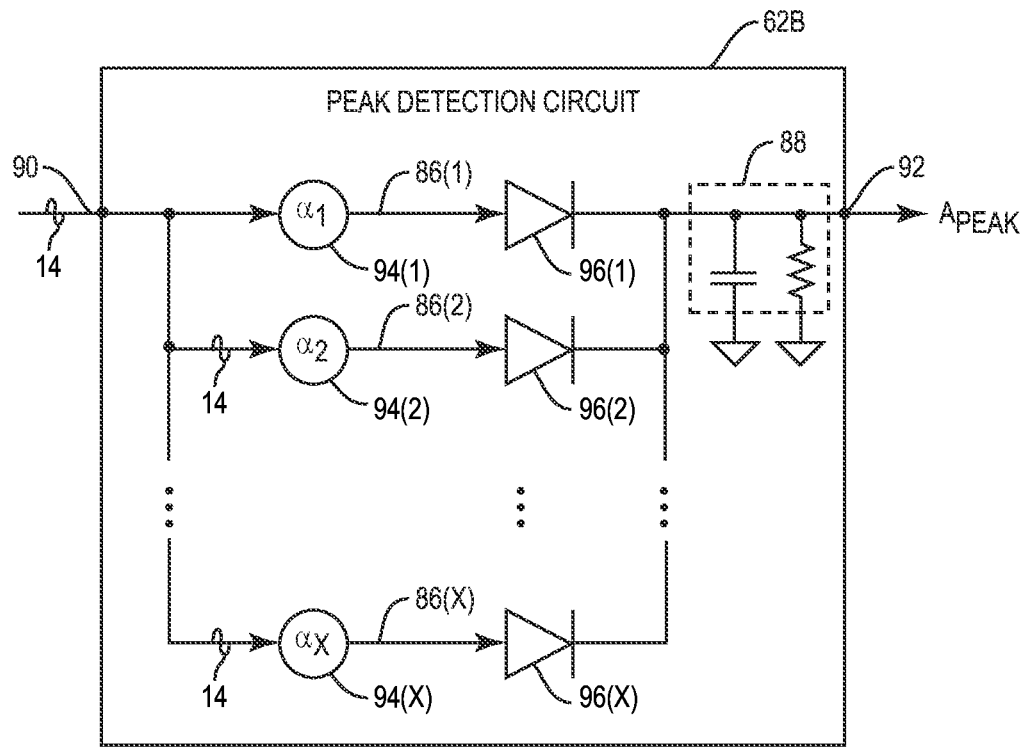
FIG. 3B is a schematic diagram of an exemplary peak detection circuit configured according to another embodiment of the present disclosure to support fast peak amplitude detection of the RF signal in FIG. 1.

FIG. 3B is a schematic diagram of an exemplary peak detection circuit 62B configured according to one embodiment of the present disclosure to support fast peak amplitude detection of the RF signal 14 in FIG. 1. Common elements between FIGS. 1, 2, and 3B are shown therein with common element numbers and will not be re-described herein.

As shown in FIG. 3B, the peak detection circuit 62B includes a number of signal branches 86(1)-86(X) and a resistor-capacitor (RC) circuit 88 coupled to the signal branches 86(1)-86(X). The peak detection circuit 62B is configured to receive the RF signal 14 in the IF via a first node 90 and output the peak amplitude $A_{PEAK}$ via a second node 92. Each of the signal branches 86(1)-86(X) includes a respective one of a number of phase shifters 94(1)-94(X) coupled in series to a respective one of a number of diodes 96(1)-96(X). Each of the phase shifters 94(1)-94(X) is configured to shift the RF signal 14 by a respective one of a number of predefined phases $\alpha_1$-$\alpha_X$. Accordingly, the RC circuit 88 can detect the peak amplitude $A_{PEAK}$ of the RF signal 14 concurrently across the predefined phases $\alpha_1$-$\alpha_X$. By detecting the peak amplitude $A_{PEAK}$ concurrently across the predefined phases $\alpha_1$-$\alpha_X$, the peak detection circuit 62A is able to detect the peak amplitude $A_{PEAK}$ within the very tight temporal constraint with reduced ripples.

The signal branches 86(1)-86(X) are disposed according to a parallel arrangement. As shown in FIG. 3B, the signal branches 86(1)-86(X) are coupled directly to the first node 90 to concurrently receive the RF signal 14. In this regard, each of the phase shifters 94(2)-94(X) is configured to concurrently shift the RF signal 14 by a respective one of the predefined phases $\alpha_1$-$\alpha_X$. For example, if the predefined phase $\alpha_1$ is equal to five degrees (5°) and the predefined phase $\alpha_2$ is equal to ten degrees (10°), then the signal branch 86(1) will output the RF signal 14 with a 5° phase shift and the signal branch 86(2) will output the RF signal 14 with a 10° phase shift.

With reference back to FIG. 2, the analog ET-LUT circuit 64 may include a memory circuit (not shown) that stores one or more predetermined analog LUTs. In this regard, the analog ET-LUT circuit 64 may map the peak amplitude $A_{PEAK}$ to the ET target voltage $V_{TGT}$ based on any one of the predetermined analog LUTs. The analog ET-LUT circuit 64 may select one of the predetermined analog LUTs for mapping the peak amplitude $A_{PEAK}$ to the ET target voltage $V_{TGT}$ based on a range of factors, including but not limited to a voltage standing wave ratio (VSWR) at any one or more of the first output nodes 24(1)-24(N).

A VSWR is a ratio that numerically describes how well a source impedance, such as an impedance of the ETIC 16 in FIG. 1, matches a load impedance, such as any of the load-line impedances $Z_1$-$Z_N$ seen at any of the first output nodes 24(1)-24(N). A one-to-one (1:1) VSWR, which is commonly referred to as a nominal VSWR, indicates a perfect match between the source impedance and the load impedance. As a result, the ETIC 16 can provide the first ET voltages $V_{CC-1}$-$V_{CC-N}$ to the power amplifiers 12(1)-12(N) without any amplitude distortion. In contrast, if the source impedance does not properly match with the load impedance, the VSWR will be different from the nominal VSWR (e.g., 2:1, 3:1, etc.). As a result, the first ET voltages $V_{CC-1}$-$V_{CC-N}$ received by the power amplifiers 12(1)-12(N) may suffer some degree of amplitude distortion, which may result in amplitude clipping in the first ET voltages $V_{CC-1}$-$V_{CC-N}$ to thereby cause the power amplifiers 12(1)-12(N) to fail an error vector magnitude (EVM) requirement. As such, it is desirable to compensate for impedance mismatch between the first output nodes 24(1)-24(N) and the power amplifiers 12(1)-12(N).

In a non-limiting example, it is possible to compensate for impedance mismatch by scaling the first amplifier gains $g_1$-$g_N$ of the first voltage amplifiers 46(1)-46(N) based on a gain scaling function f(g) and/or the first offset voltages $V_{OFF-1}$-$V_{OFF-N}$ of the first offset capacitors 48(1)-48(N) based on an offset scaling function f(o), as shown below in equations (Eq. 1 and 2).

$$G(i)=f(g)=f(Z_i/Z_{REF})\ (1 \le i \le N) \qquad (Eq.\ 1)$$

$$O(i)=f(o)=f(Z_i/Z_{REF})\ (1 \le i \le N) \qquad (Eq.\ 2)$$

In the equations (Eq. 1 and 2) above, G(i) represents a scaled first amplifier gain for any of the first voltage amplifiers 46(1)-46(N), O(i) represents a scaled first offset voltage for any of the first offset capacitors 48(1)-48(N), Z represents any of the load-line impedances $Z_1$-$Z_N$, and $Z_{REF}$ represents a nominal load-line impedance corresponding to the nominal VSWR (1:1). In an embodiment, the load detection circuit 68 can be configured to estimate the load-line impedances $Z_1$-$Z_N$ seen at the first output nodes 24(1)-24(N).

The load detection circuit 68 is configured to receive the first low-frequency sense currents $I_{SDC-1}$-$I_{SDC-N}$, the first high-frequency sense currents $I_{SAC-1}$-$I_{SAC-N}$, and feedbacks of the first ET voltages $V_{CC-1}$-$V_{CC-N}$. In a non-limiting example, each of the load-line impedances $Z_1$-$Z_N$ can be estimated based on an equation (Eq. 3) below.

$$Z_i \approx dI_{SDC-i}/dV_{CC-i}\ (1 \le i \le N) \qquad (Eq.\ 3)$$

In addition to scaling the first amplifier gains $g_1$-$g_N$ and the first offset voltages $V_{OFF-1}$-$V_{OFF-N}$, the target voltage processing circuit 66 can be configured to equalize the first ET target voltages $V_{TGT-1}$-$V_{TGT-N}$ to compensate for impedance variation among the load-line impedances $Z_1$-$Z_N$. For specific embodiments of the target voltage processing circuit 66 configured to equalize the first ET target voltages $V_{TGT-1}$-$V_{TGT-N}$, please refer to U.S. patent application Ser. No. 17/142,350, entitled "EQUALIZER FOR ENVELOPE POWER SUPPLY CIRCUITRY."

With reference back to FIG. 1, each of the first voltage amplifiers 46(1)-46(N) is configured to generate a respective one of the first initial ET voltages $V_{CC-1}$-$V_{CC-N}$ based on one of supply voltages $V_{SUPL}$ and $V_{SUPH}$ ($V_{SUPH}$>$V_{SUPL}$). The control circuit 38 may determine which of the supply voltages $V_{SUPL}$ and $V_{SUPH}$ is provided to any of the first voltage amplifiers 46(1)-46(N) based on a respective one of the first ET target voltages $V_{TGT-1}$-$V_{TGT-N}$. For example, if any of the first ET target voltages $V_{TGT-1}$-$V_{TGT-N}$ is above a first threshold, the control circuit 38 will provide the higher supply voltage $V_{SUPH}$ to a corresponding one of the first voltage amplifiers 46(1)-46(N). Otherwise, the control circuit 38 will provide the lower supply voltage $V_{SUPL}$ to the corresponding one of the first voltage amplifiers 46(1)-46(N).

Similarly, the second voltage amplifier 54 is configured to generate the second initial ET voltage $V_{CCD}$ based on one of the supply voltages $V_{SUPL}$ and $V_{SUPH}$. For example, if the second ET target voltage $V_{TGTD}$ is above a second threshold, the control circuit 38 will provide the higher supply voltage $V_{SUPH}$ to the second voltage amplifier 54. Otherwise, the control circuit 38 will provide the lower supply voltage $V_{SUPL}$ to the second voltage amplifier 54.

Figure 4:
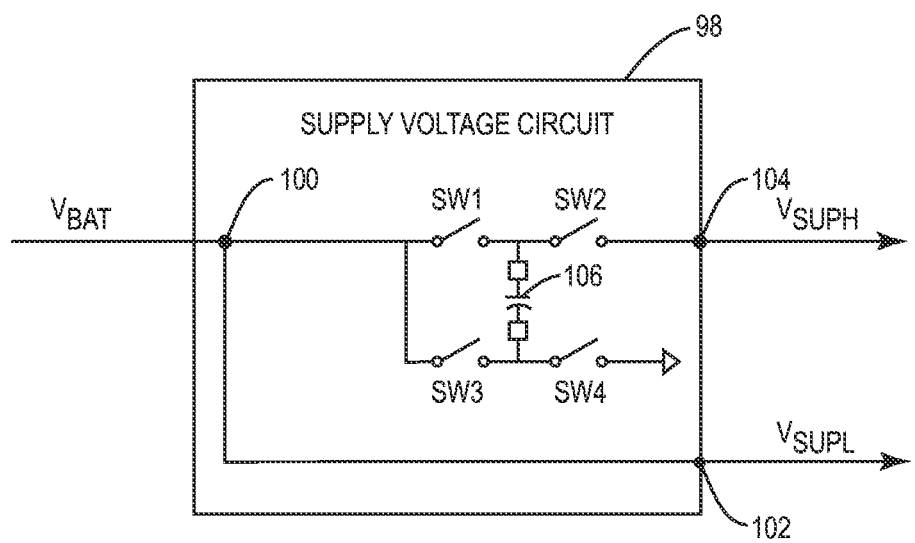
FIG. 4 is schematic diagram providing an exemplary illustration of a supply voltage circuit in the ETIC in FIG. 1.

The ETIC 16 can include a supply voltage circuit 98 configured to generate the supply voltages $V_{SUPL}$ and $V_{SUPH}$ based on a battery voltage $V_{BAT}$. In this regard, FIG. 4 is schematic diagram providing an exemplary illustration of the supply voltage circuit 98 in the ETIC 16 FIG. 2 for generating the supply voltages $V_{SUPL}$ and $V_{SUPH}$. Common elements between FIGS. 1 and 4 are shown therein with common element numbers and will not be re-described herein.

The supply voltage circuit 98 includes an input node 100 coupled to the battery voltage $V_{BAT}$. The supply voltage circuit 98 includes a first output node 102 and a second output node 104 configured to output the lower supply voltage $V_{SUPL}$ and the higher supply voltage $V_{SUPH}$, respectively. The supply voltage circuit 98 includes switches SW1, SW2, SW3, and SW4, which can be any type of switches. The switches SW1 and SW2 are coupled in series between the input node 100 and the second output node 104. The switches SW3 and SW4 are coupled in series between the input node 100 and the first output node 102. The supply voltage circuit 98 includes a fly capacitor 106 having one end coupled in between the switch SW1 and the switch SW2, and another end coupled in between the switch SW3 and the switch SW4.

In a non-limiting example, the supply voltage circuit 98 can be controlled to generate the lower supply voltage $V_{SUPL}$ at the battery voltage $V_{BAT}$ ($V_{SUPL}$=$V_{BAT}$) and the higher supply voltage $V_{SUPH}$ at two times the battery voltage $V_{BAT}$ ($V_{SUPH}$=2×$V_{BAT}$). To generate the higher supply voltage $V_{SUPH}$ at 2×$V_{BAT}$, the switches SW2 and SW4 are closed, while the switches SW2 and SW3 remain open. As such, the fly capacitor 106 can be charged up to the battery voltage $V_{BAT}$. Subsequently, the switches SW2 and SW4 are opened, while the switches SW2 and SW3 are closed. Accordingly, the higher supply voltage $V_{SUPH}$ can be outputted at 2*$V_{BAT}$.

Those skilled in the art will recognize improvements and modifications to the preferred embodiments of the present disclosure. All such improvements and modifications are considered within the scope of the concepts disclosed herein and the claims that follow.

What is claimed is:

1. An envelope tracking (ET) power management apparatus comprising:
   an ET integrated circuit (ETIC) comprising:
      a plurality of first ET voltage circuits coupled between a common node and a plurality of first output nodes and each configured to generate a respective one of a plurality of first ET voltages at a respective one of the plurality of first output nodes based on a respective one of a plurality of first ET target voltages;
a second ET voltage circuit coupled between the common node and a second output node and configured to generate a second ET voltage based on a second ET target voltage; and
a control circuit configured to:
determine a maximum ET target voltage among the plurality of first ET target voltages; and
cause any one of the plurality of first ET voltage circuits receiving the maximum ET target voltage to provide the respective one of the plurality of first ET voltages to the common node as a common node voltage to thereby drive a low-frequency current from the common node toward the plurality of first output nodes and the second output node.

2. The ET power management apparatus of claim 1 further comprising a plurality of power amplifiers configured to concurrently amplify a radio frequency (RF) signal, each of the plurality of power amplifiers comprises a driver stage amplifier and one or more output stage amplifiers, wherein:
the one or more output stage amplifiers in each of the plurality of power amplifiers is coupled to a respective one of the plurality of first output nodes to receive a respective one of the plurality of first ET voltages and the low-frequency current; and
the driver stage amplifier in each of the plurality of power amplifiers is coupled to the second output node to receive the second ET voltage and the low-frequency current.

3. The ET power management apparatus of claim 2 wherein the ETIC further comprises a tracker circuit coupled to the common node and configured to generate the low-frequency current at the common node.

4. The ET power management apparatus of claim 3 wherein the tracker circuit comprises:
a multi-level charge pump (MCP) configured to generate a low-frequency voltage; and
a power inductor coupled between the MCP and the common node and configured to induce the low-frequency current based on the low-frequency voltage.

5. The ET power management apparatus of claim 4 wherein the control circuit is further configured to control the MCP to generate the low-frequency voltage corresponding to the maximum ET target voltage.

6. The ET power management apparatus of claim 3 wherein the control circuit is further configured to cause the any one of the plurality of first ET voltage circuits receiving the maximum ET target voltage to pass the low-frequency current to the respective one of the plurality of first output nodes.

7. The ET power management apparatus of claim 6 wherein the control circuit is further configured to:
cause any of the plurality of first ET voltage circuits not receiving the maximum ET target voltage to regulate the low-frequency current based on a respective one of the plurality of first ET target voltages; and
cause the second ET voltage circuit to regulate the low-frequency current based on the second ET target voltage.

8. The ET power management apparatus of claim 3 wherein, when the RF signal is modulated below a defined modulation bandwidth, the control circuit is further configured to cause the second ET voltage circuit to:
output the common node voltage at the second output node as the second ET voltage; and
provide the low-frequency current from the common node to the second output node.

9. The ET power management apparatus of claim 3 wherein:
the plurality of first ET voltage circuits each comprises:
a first voltage amplifier having a first amplifier gain and configured to generate a first initial ET voltage based on a respective one of the plurality of first ET target voltages; and
a first offset capacitor configured to raise the first initial ET voltage by a first offset voltage to generate a respective one of the plurality of first ET voltages at a respective one of the plurality of first output nodes; and
the second ET voltage circuit comprises:
a second voltage amplifier having a second amplifier gain and configured to generate a second initial ET voltage based on the second ET target voltage; and
a second offset capacitor configured to raise the second initial ET voltage by a second offset voltage to generate the second ET voltage at the second output node.

10. The ET power management apparatus of claim 9 wherein the ETIC further comprises a target voltage circuit configured to generate the plurality of first ET target voltages and the second ET target voltage based on a time-variant power envelope associated with the RF signal.

11. The ET power management apparatus of claim 10 wherein the target voltage circuit comprises:
a peak detection circuit configured to determine a peak amplitude of the time-variant power envelope;
an analog ET look-up table (ET-LUT) circuit configured to map the peak amplitude to an ET target voltage; and
a target voltage processing circuit configured to generate the plurality of first ET target voltages based on the ET target voltage.

12. The ET power management apparatus of claim 11 wherein the peak detection circuit comprises:
a plurality of signal branches disposed in a cascade arrangement and each configured to shift the RF signal by a respective one of a plurality of predefined phases; and
a resistor-capacitor (RC) circuit configured to detect the peak amplitude of the RF signal across the plurality of predefined phases.

13. The ET power management apparatus of claim 11 wherein the peak detection circuit comprises:
a plurality of signal branches disposed in a parallel arrangement and each configured to shift the RF signal by a respective one of a plurality of predefined phases; and
a resistor-capacitor (RC) circuit configured to detect the peak amplitude of the RF signal across the plurality of predefined phases.

14. The ET power management apparatus of claim 11 wherein the target voltage circuit further comprises a load detection circuit configured to:
estimate a plurality of load-line impedances seen at the plurality of first output nodes, respectively; and
provide the plurality of estimated load-line impedances to the target voltage processing circuit.

15. The ET power management apparatus of claim 14 wherein the target voltage processing circuit is further configured to equalize each of the plurality of first ET target voltages based on a respective one of the plurality of estimated load-line impedances.

16. The ET power management apparatus of claim 14 wherein the target voltage processing circuit is further configured to scale the first amplifier gain and the first offset voltage in each of the plurality of first ET voltage circuits based on a respective one of the plurality of estimated load-line impedances.

17. The ET power management apparatus of claim 9 wherein:
the plurality of first ET voltage circuits each further comprises:
a first hybrid circuit coupled between the common node and the respective one of the plurality of first output nodes and configured to operate in a switch mode or a low-dropout (LDO) mode; and
a first offset-loop controller configured to control the first hybrid circuit in the LDO mode to regulate the low-frequency current; and
the second ET voltage circuit further comprises:
a second hybrid circuit coupled between the common node and the second output node and configured to operate in the switch mode or the LDO mode; and
a second offset-loop controller configured to control the second hybrid circuit in the LDO mode to regulate the low-frequency current.

18. The ET power management apparatus of claim 17 wherein:
the first voltage amplifier in each of the plurality of first ET voltage circuits is further configured to source or sink a first high-frequency current and generate a first high-frequency sense current proportional to the first high-frequency current; and
the first offset-loop controller in each of the plurality of first ET voltage circuits is further configured to control the first hybrid circuit in the LDO mode to regulate the low-frequency current based on the first high-frequency sense current.

19. The ET power management apparatus of claim 17 wherein the control circuit is further configured to:
control the first hybrid circuit in the any one of the plurality of first ET voltage circuits receiving the maximum ET target voltage to operate in the switch mode to provide the respective one of the plurality of first ET voltages to the common node as the common node voltage and provide the low-frequency current to the respective one of the plurality of first output nodes;
control the first hybrid circuit in any of the plurality of first ET voltage circuits not receiving the maximum ET target voltage to operate in the LDO mode to reduce the low-frequency current at a respective one of the plurality of first output nodes; and
control the second hybrid circuit in the second ET voltage circuit to operate in the LDO mode to regulate the low-frequency current at the second output node.

20. The ET power management apparatus of claim 17 wherein, when the RF signal is modulated below a defined modulation bandwidth, the control circuit is further configured to:
control the first hybrid circuit in the any one of the plurality of first ET voltage circuits receiving the maximum ET target voltage to operate in the switch mode to provide the respective one of the plurality of first ET voltages to the common node as the common node voltage and provide the low-frequency current to the respective one of the plurality of first output nodes;
control the first hybrid circuit in any of the plurality of first ET voltage circuits not receiving the maximum ET target voltage to operate in the LDO mode to reduce the low-frequency current at a respective one of the plurality of first output nodes; and
deactivate the second voltage amplifier and control the second hybrid circuit in the second ET voltage circuit to operate in the switch mode to provide the low-frequency current from the common node to the second output node.

* * * * *